US006495409B1

(12) United States Patent
Manfra et al.

(10) Patent No.: US 6,495,409 B1
(45) Date of Patent: Dec. 17, 2002

(54) MOS TRANSISTOR HAVING ALUMINUM NITRIDE GATE STRUCTURE AND METHOD OF MANUFACTURING SAME

(75) Inventors: Michael J. Manfra, Short Hills, NJ (US); Loren N. Pfeiffer, Morristown, NJ (US); Kenneth W. West, Mendham, NJ (US); Yiu-Huen Wong, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/472,331

(22) Filed: Dec. 23, 1999

Related U.S. Application Data
(60) Provisional application No. 60/117,186, filed on Jan. 26, 1999.

(51) Int. Cl.[7] .................. H01L 21/8238; H01L 29/76
(52) U.S. Cl. .................. 438/216; 438/261; 438/591; 438/240; 438/585; 257/410; 257/324
(58) Field of Search .................. 438/216, 261, 438/180, 46, 585; 257/315; 117/84, 204

(56) References Cited

U.S. PATENT DOCUMENTS

| 4,172,754 A | * | 10/1979 | Dryburgh | 156/213 |
| 5,650,361 A | * | 7/1997 | Radhakrishnan | 438/216 |
| 5,851,896 A | | 12/1998 | Summerfelt | |
| 5,858,086 A | * | 1/1999 | Hunter | 117/84 |
| 5,882,961 A | * | 3/1999 | Klingbeil, Jr. et al. | 438/180 |
| 5,972,109 A | * | 10/1999 | Hunter | 117/204 |
| 6,031,263 A | * | 2/2000 | Forbes et al. | 257/315 |
| 6,045,612 A | * | 4/2000 | Hunter | 117/84 |
| 6,069,021 A | * | 5/2000 | Terashima et al. | 438/46 |
| 6,255,671 B1 | * | 7/2001 | Bojarxzuk, Jr. et al. | 257/103 |

OTHER PUBLICATIONS

Sitar et al. "Growth Of AlN/GaN layered structures by gas source" J. Vac. Sci, Technology, pp. 316–322, Mar./Apr. 1990.*
S. Wolf, Silicon Processing for the VLSI Era, vol. 1—Process Technology. 1986.*
W. J. Meng et al., Growth of epitaxial aluminum nitride and aluminum nitride/ziconium nitride superlattice on Si(111), J. Vac Sci Technol. A 10(4), Jul./Aug. 1992.*
P. W. Wisk et al., Growth of GaN, AlN and InN by Electron Cyclotron Resonance Metal Organic Molecular Beam Epitaxy, Mat. Res. Soc. Symp. Proc. vol. 282 1993 Materials Research Sociey.*

* cited by examiner

Primary Examiner—Matthew Smith
Assistant Examiner—Belur Keshavan

(57) ABSTRACT

An MOS transistor comprising a substrate, a source, a drain, and a gate, wherein the gate comprises aluminum nitride. Aluminum nitride is epitaxially grown on the silicon substrate at a substrate temperature of about 600° C. and subsequently annealed at a substrate temperature of about 950° C.

30 Claims, 1 Drawing Sheet

US 6,495,409 B1

MOS TRANSISTOR HAVING ALUMINUM NITRIDE GATE STRUCTURE AND METHOD OF MANUFACTURING SAME

RELATED APPLICATIONS

This application claims priority to U.S. Provisional Application No. 60/117,186 filed Jan. 26, 1999, which provisional application is incorporated by reference herein.

BACKGROUND OF THE INVENTION

1. Field of the Invention

The present invention relates to metal-oxide-silicon (MOS) transistors, and more particularly, to improved materials for use as gate structures of MOS transistors.

2. Description of the Related Art

MOS transistors have been a dominant technology in the silicon industry. FIG. 1 illustrates a conventional MOS transistor 10 comprising a silicon substrate 12, a source 14, a drain 18, and a gate 22. The MOS transistor 10 further comprises a substrate electrode 26, a source electrode 16, a drain electrode 20, and a gate electrode 24 formed on the substrate 12, the source 14, the drain 18, and the gate 22, respectively. Electrical connection to the substrate electrode 26, the source electrode 16, the drain electrode 20, and the gate electrode 20 is via a substrate terminal B, a source terminal S, a drain terminal D, and a gate terminal G, respectively.

As is known to those skilled in the art, the silicon substrate 12 can be either p-type (as shown) or n-type, and the source 14 and drain 18 can be n$^+$-type (as shown) or p$^+$-type depending on the conductivity of the substrate 12. As is also known to those skilled in the art, carriers enter the MOS transistor 10 through the source terminal S, leave through the drain terminal D, and are subject to the control of the action of signals applied to the gate electrode G. The voltage applied to the gate terminal G relative to ground is $V_G$ while the voltage applied to the drain electrode D relative to ground is $V_D$. It should be understood that many variations of the foregoing structure are well know to those skilled in the art and the foregoing structure is meant to be illustrative and not limiting.

As shown in FIG. 1, the material used for the gate 22 is silicon dioxide (SiO$_2$). There are certain disadvantages, however, associated with using such a gate material. In particular, in response to various market demands, the level of integration of MOS transistor based integrated circuit devices continues to increase. As a result, the size of MOS transistors in those devices decreases. In addition, in order to lower the power density consumed by the devices, the gate voltage $V_G$ is lowered accordingly. This leads to a need for thinner gate structures. It is contemplated that in order to meet future performance demands, conventional MOS transistors will be required to have gate thickness that are well below the tunneling limit of SiO$_2$. MOS transistors incorporating such thin gate structures will suffer from excess leakage, which could result in device failure.

SUMMARY OF THE INVENTION

Accordingly, the present invention is directed to a gate dielectric material for an MOS transistor that substantially obviates one or more of the problems due to limitations and disadvantages of the related art.

Additional features and advantages of the invention will be set forth in the description that follows and, in part, will be apparent from the description, or may be learned by practice of the invention. The objectives and other advantages of the invention will be realized and attained by the gate dielectric material particularly pointed out in the written description and claims hereof as well as the appended drawings.

To achieve these and other advantages and in accordance with the purposes of the invention, as embodied and broadly described, the invention provides an MOS transistor comprising a substrate, a source, a drain, and a gate, wherein the gate comprises aluminum nitride.

To further achieve these and other advantages and in accordance with the purposes of the invention, as embodied and broadly described, the invention also provides a method of making an MOS transistor comprising forming a source and drain in a substrate, and forming a gate on the substrate, wherein the gate comprises aluminum nitride.

To still further achieve these and other advantages and in accordance with the purposes of the invention, as embodied and broadly described, the invention also provides a method of forming an aluminum nitride film on a silicon substrate comprising epitaxially growing aluminum nitride on the silicon substrate at a substrate temperature of about 600° C., and subsequently annealing the substrate and epitaxially grown aluminum nitride at a substrate temperature of about 950° C.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate several embodiments of the invention and, together with the written description, serve to explain the principles of the invention. In the drawings.

DESCRIPTION OF THE PREFERRED EMBODIMENTS

Reference will now be made in detail to the presently preferred embodiment of the invention, an example of which is illustrated in the accompanying drawings.

Figure 1:
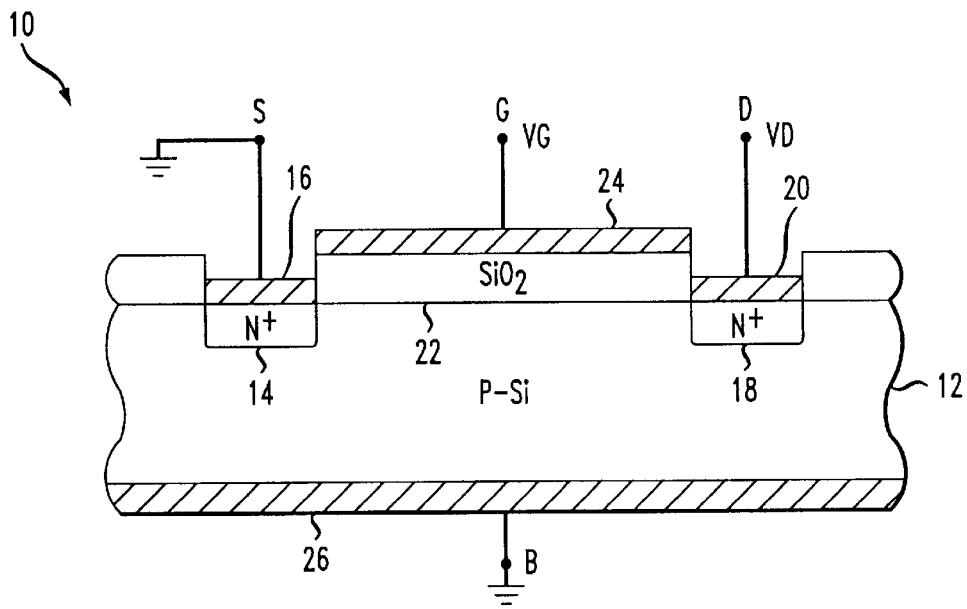
FIG. 1 is a cross-sectional view of a conventional MOS transistor.
Figure 2:
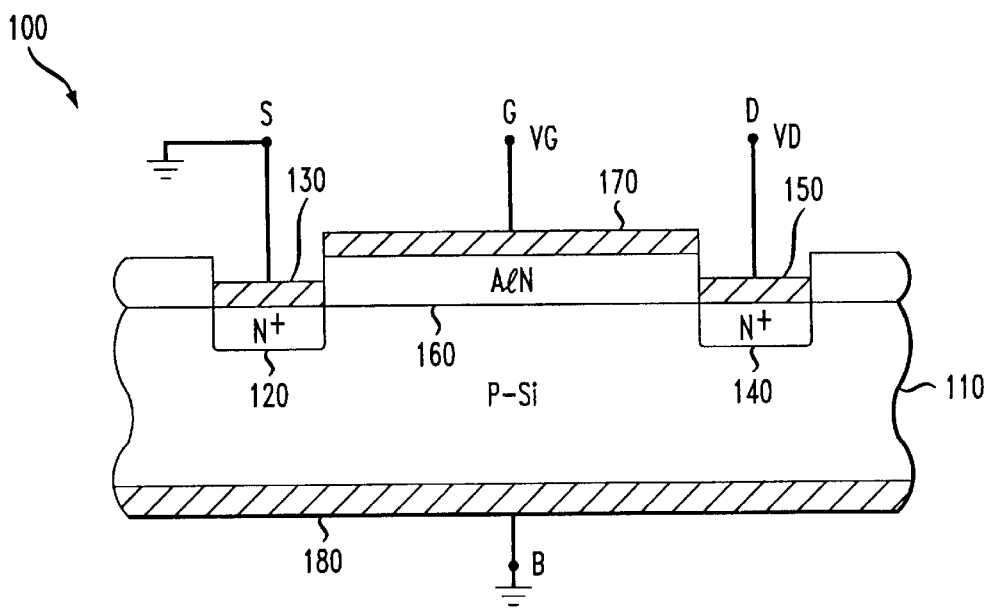
FIG. 2 is a cross-sectional view of an MOS transistor according to the present invention.

An MOS transistor according to the present invention is shown in FIG. 2 and is designated generally by reference numeral 100. As embodied herein, the MOS transistor 100 comprises a silicon substrate 110, a source 120, a drain 140, and a gate 160. The MOS transistor 100 further comprises a substrate electrode 180, a source electrode 130, a drain electrode 150, and a gate electrode 170 formed on the substrate 110, the source 120, the drain 140, and the gate 160, respectively. Electrical connection to the substrate electrode 110, the source electrode 130, the drain electrode 150, and the gate electrode 170 is via a substrate terminal B, a source terminal S, a drain terminal D, and a gate terminal G, respectively. It should be appreciated that the MOS transistor 100 is similar to the MOS transistor 10 of FIG. 1 except that the material used for the gate 160 is aluminum nitride (AlN).

It should be appreciated that the use of AlN for the gate material of the MOS transistor 100 has certain advantages over the use of $SiO_2$ for the gate material of the MOS transistor 10. First, because AlN has a higher dielectric constant than $SiO_2$ (AlN has a dielectric constant of about 9, while $SiO_2$ has a dielectric constant of only about 4), the gate 160 can be made proportionally thicker than the gate 22 in the same applications. Thus, the use of AlN for the gate 160 allows for a physically thicker film to act as a tunnel barrier, yet provides the same effective thickenss from the point of view of capacitance. Second, when compared to the $SiO_2$ gate of the MOS transistor 10, the AlN gate 160 serves as a better diffusion barrier for substrate dopants (e.g. doped polysilicon, metal silicide, or metal), especially when the AlN gate 160 is grown expitaxially as described below. Third, when compared to the $SiO_2$ gate 22, the lower bandgap of the AlN gate 160 (the bandgap of the AlN is about 6 eV, while the bandgap for $SiO_2$ is about 9 eV) offers the benefit of lower leakage current through the gate 160.

Preferably, the gate 160 of MOS transistor 100 is fabricated using an epitaxial growth technique, such as molecular beam epitaxy (MBE). One advantage of fabricating the gate 160 using epitaxial growth is that a high quality, single crystalline AlN film can be obtained and the thickness of the gate 160 can be accurately controlled. With regard to the quality of the gate 160, epitaxial growth results in the gate 160 having a low defect density. Furthermore, epitaxial growth produces a good lattice match between the gate 160 and the substrate 110 resulting in a reduction of interfacial traps (also referred to as surface states or interface states) at the gate 160/substrate 110 interfaces. As is know to those skilled in the art, interfacial traps in Si/dielectric structures are the result of dangling bonds at the interface between the atoms of the Si and the dielectric. In the case of $Si/SiO_2$ structures, the interface is between crystalline Si and amorphous $SiO_2$. This could theoretically lead to one dangling bond per atom, or $6\times10^{14}$ $cm^{-2}$ interfacial traps. Indeed, interfacial trap levels of $10^{10}$ $cm^{-2}$ are found experimentally for what is considered by those skilled in the art to be "good" thermal $SiO_2$ on Si. In the case of AlN/Si structures, however, both materials are crystalline and further they share an epitaxial relationship. Thus, the only opportunities for dangling bonds are those due to the 1 to 1.18 lattice mismatch between the AlN and Si. Accordingly, the theoretically maximum number of interfacial traps is reduced by at least a factor of about $5^2$ or 25. This reduction of interfacial traps allows for lower and better control of the threshold voltages applied to the MOS transistor 100.

EXAMPLES

Using a Gem II MBE machine made by EPI Products Co., Eden Prairie, Minn., 10–100 Å thick AlN films were grown on (111) silicon substrates, each under the following conditions.

The substrate was first prepared by cleaning in HF and blown dry with $N_2$ gas and then loaded into the load lock of the MBE machine. The substrate was next baked at 450° C. in a vacuum and transferred to the MBE machine growth chamber where it was heated to 900° C. to evaporate residual surface contaminants and oxides. Evaporation of the residual surface contaminants and oxides was verified by examining the reflected electron diffraction pattern produced by a 15 keV electron beam incident to the substrate surface at about a 1° grating angle.

Inside the growth chamber, the substrate temperature was allowed to lower until it reached about 600° C., whereupon the shutter from the aluminum effusion cell was opened. Two seconds later, the shutter from the nitrogen rf plasma cell was opened. The aluminum effusion cell was comprised of a conventional tantalum furnace that heated a pyrolytic boron nitride crucible containing molten aluminum. The temperature was calibrated in previous experiments to produce a flux of aluminum atoms sufficient to provide an AlN growth rate of about 0.1 monolayer per second. The rf plasma cell model had a $N_2$ gas flow rate of 0.75 sccm/minute and was operated in the bright-optical mode with 450 watts of net absorbed rf power at 13.5 MHz. The base pressure of the growth chamber was about $10^{-10}$ torr, the aluminum flux had a beam equivalent pressure of about $1\times10^{-8}$ torr, and the nitrogen rf plasma flux had a beam equivalent pressure of about $5\times10^{-5}$ torr.

After an appropriate amount of AlN was deposited on the substrate to form a film of desired thickness (i.e., 10–100 Å), the deposition process was stopped and the substrate temperature was raised to about 950° C. for about a 10-minute anneal. It was found that the deposition at low temperature (about 600° C.) suppressed any tendency for the AlN to form islands, thus insuring a smooth, uniform and continuous film on the substrate. Further, it was found that the 950° C. anneal after growth allowed the aluminum and nitrogen atoms to diffuse over short distances to improve the epitaxial stacking.

In the foregoing examples, the AlN films were α-phase hexagonal AlN epitaxially grown with a nominal 18% lattice mismatch to the (111) silicon substrates. However, the β-phase crystalline form of cubic or zincblend AlN can be grown on silicon if a (100) or (110) silicon substrate is substituted for the (111) silicon substrate in the above examples. In the case of the cubic form, the cubic AlN to silicon lattice mismatch would remain at 18%, but possible problems with polarization induced electric fields would be suppressed by the cubic symmetry.

It will be apparent to those skilled in the art that various modifications and variations can be made to the MOS transistor and method of the present invention without departing from the spirit or scope of the invention. Thus, it is intended that the present invention covers the modifications and variations of this invention provided they come within the scope of the appended claims and their equivalents.

What is claimed is:

1. A method of making an MOS transistor comprising:
   forming a source and drain in a substrate; and
   forming a gate on the substrate using an epitaxial growth technique, wherein the gate comprises aluminum nitride and a lattice mismatch between the substrate and the aluminum nitride is less than 18%.

2. The method of claim 1, further comprising forming a substrate electrode, a source electrode, a drain electrode, and a gate electrode on the substrate, the source, the drain, and the gate, respectively.

3. The method of claim 1, wherein the epitaxial growth technique is molecular beam epitaxy.

4. The method of claim 1, wherein the substrate is a (111) silicon substrate.

5. The method of claim 4, wherein the aluminum nitride is α-phase hexagonal aluminum nitride.

6. The method of claim 5, wherein the α-phase hexagonal aluminum nitride is epitaxially grown with a nominal 18% lattice mismatch to the (111) silicon substrate.

7. The method of claim 1, wherein the substrate is a (100) silicon substrate.

8. The method of claim 7, wherein the aluminum nitride is β-phase crystalline form of cubic aluminum nitride.

9. The method of claim 8, wherein the β-phase crystalline form of cubic aluminum nitride is epitaxially grown with a nominal 18% lattice mismatch to the (100) silicon substrate.

10. The method of claim 7, wherein the aluminum nitride is β-phase crystalline form of zincblend aluminum nitride.

11. The method of claim 1, wherein the substrate is a (110) silicon substrate.

12. The method of claim 11, wherein the aluminum nitride is β-phase crystalline form of cubic aluminum nitride.

13. The method of claim 12, wherein the β-phase crystalline form of cubic aluminum nitride is epitaxially grown with a nominal 18% lattice mismatch to the (110) silicon substrate.

14. The method of claim 11, wherein the aluminum nitride is β-phase crystalline form of zincblend aluminum nitride.

15. A method of forming an aluminum nitride film on a silicon substrate comprising:

epitaxially growing aluminum nitride on the silicon substrate at a substrate temperature of about 600° C., the silicon substrate and the aluminum nitride film having a lattice mismatch of less than 18%; and subsequently annealing the substrate and epitaxially grown aluminum nitride at a substrate temperature of about 950° C.

16. The method of claim 15, wherein the annealing is performed for 10 minutes.

17. The method of claim 15, wherein the aluminum nitride is epitaxially grown at a rate of about 0.1 monolayer per second.

18. The method of claim 15, wherein the aluminum nitride file is 10–100 Å thick.

19. The method of claim 15, wherein the aluminum nitride is grown by molecular beam epitaxy.

20. The method of claim 15, wherein the substrate is a (111) silicon substrate.

21. The method of claim 20, wherein the aluminum nitride is α-phase hexagonal aluminum nitride.

22. The method of claim 21, wherein the α-phase hexagonal aluminum nitride is epitaxially grown with a nominal 18% lattice mismatch to the (111) silicon substrate.

23. The method of claim 18, wherein the substrate is a (100) silicon substrate.

24. The method of claim 23, wherein the aluminum nitride is β-phase crystalline form of cubic aluminum nitride.

25. The method of claim 24, wherein the β-phase crystalline form of cubic aluminum nitride is epitaxially grown with a nominal 18% lattice mismatch to the (100) silicon substrate.

26. The method of claim 23, wherein the aluminum nitride is β-phase crystalline form of zincblend aluminum nitride.

27. The method of claim 15, wherein the substrate is a (110) silicon substrate.

28. The method of claim 27, wherein the aluminum nitride is β-phase crystalline form of cubic aluminum nitride.

29. The method of claim 27, wherein the β-phase crystalline form of cubic aluminum nitride is epitaxially grown with a nominal 18% lattice mismatch to the (110) silicon substrate.

30. The method of claim 27, wherein the aluminum nitride is β-phase crystalline form of zincblend aluminum nitride.

* * * * *